(12) United States Patent
Hsu et al.

(10) Patent No.: US 7,031,899 B2
(45) Date of Patent: Apr. 18, 2006

(54) SYSTEM FOR CHARACTERIZING SIMULATED CIRCUIT LOGIC AND BEHAVIOR

(75) Inventors: Yu-Chin Hsu, Cupertino, CA (US); Furshing Tsai, San Jose, CA (US); Tayung Liu, Sunnyvale, CA (US); Bassam Tabbara, San Jose, CA (US); Kunming Ho, Fremont, CA (US); George Bakewell, McMinnville, OR (US); Yirng-An Chen, San Jose, CA (US); Scott Sandler, Beavercreek, OR (US)

(73) Assignee: Novas Software, Inc., San Jose, CA (US)

( * ) Notice: Subject to any disclaimer, the term of this patent is extended or adjusted under 35 U.S.C. 154(b) by 694 days.

(21) Appl. No.: 09/829,535

(22) Filed: Apr. 9, 2001

(65) Prior Publication Data

US 2002/0147576 A1 Oct. 10, 2002

(51) Int. Cl.
*G06F 3/147* (2006.01)
*G06F 3/153* (2006.01)
(52) U.S. Cl. .......................... 703/15; 703/16
(58) Field of Classification Search .............. 703/14, 703/15, 16, 17; 345/763, 440; 714/732, 714/724; 716/11, 5; 715/771
See application file for complete search history.

(56) References Cited

U.S. PATENT DOCUMENTS

| | | | | |
|---|---|---|---|---|
| 5,111,413 A | * | 5/1992 | Lazansky et al. | 703/14 |
| 5,220,512 A | * | 6/1993 | Watkins et al. | 716/11 |
| 5,751,592 A | * | 5/1998 | Takai et al. | 716/5 |
| 5,867,399 A | * | 2/1999 | Rostoker et al. | 716/18 |
| 5,937,190 A | * | 8/1999 | Gregory et al. | 717/131 |
| 6,154,719 A | * | 11/2000 | Saitoh et al. | 703/13 |
| 6,442,741 B1 | * | 8/2002 | Schultz | 716/6 |
| 6,789,242 B1 | * | 9/2004 | Liu | 716/6 |

* cited by examiner

*Primary Examiner*—Paul L. Rodriguez
*Assistant Examiner*—Jason Proctor
(74) *Attorney, Agent, or Firm*—Daniel J. Bedell; Smith-Hill and Bedell

(57) ABSTRACT

A circuit simulator simulates a circuit described by a circuit logic model as having a set of clocked registers interconnected by un-clocked logic to produce waveform data indicating states of each circuit input signal and of each register output signal as functions of clock signal edge timing. The waveform data and the logic model are then processed to produce a temporal schema model characterizing the circuit's logic and behavior. A display based on the temporal schema model depicts circuit behavior using separate symbols to represent successive circuit input signal states and register output signal states at various times during the simulation. The same display also graphically depicts fan-in or fan-out logical relationships by which circuit input signal states and register output signal states influence register input signal states.

18 Claims, 9 Drawing Sheets

Figure 4:
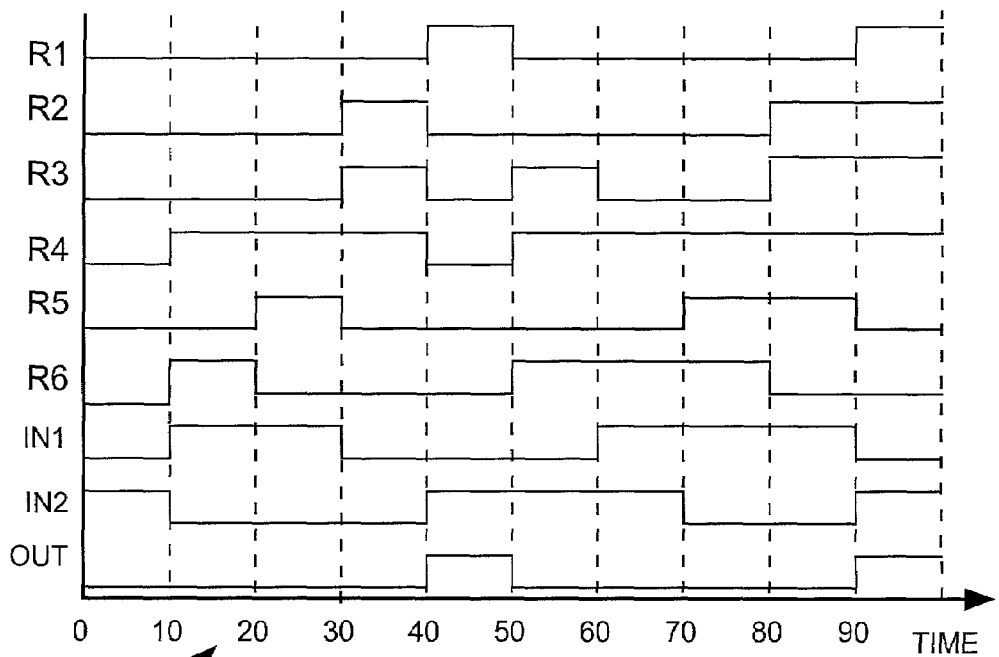

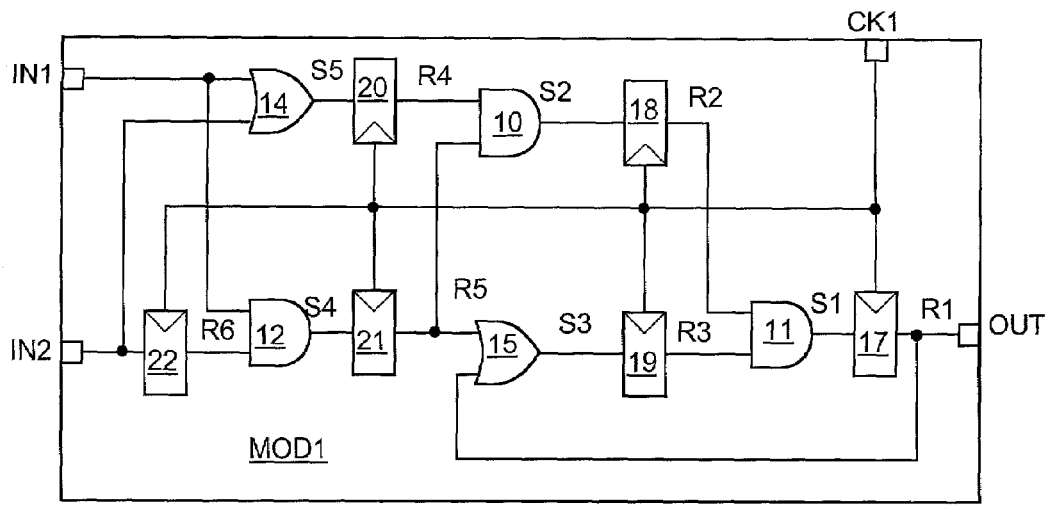
FIG. 1
(PRIOR ART)
```
module MOD1 (CK1,IN1,IN2,OUT);
    input [width-1:0] CK1;
    input [width-1:0] IN1,IN2;
    output [width-1:0] OUT
    wire [width-1:0]S1,S2,S3,S4,S5
    Reg[width-1:0] R1,R2,R3,R4,R5,R6;
    always @posedge(CK1)
        R1  = S1;
        S1  = R2 & R3;
        R2  = S2;
        S2  = R4 & S5;
        R3  = S3;
        S3  = R1| R5;
        R4  = S5;
        S4  = IN1 & R6;
        S5  = IN1 | IN2;
        R5  = S4;
        R6  = IN2;
    assign OUT = R1;
endmodule
```
FIG. 2
(PRIOR ART)
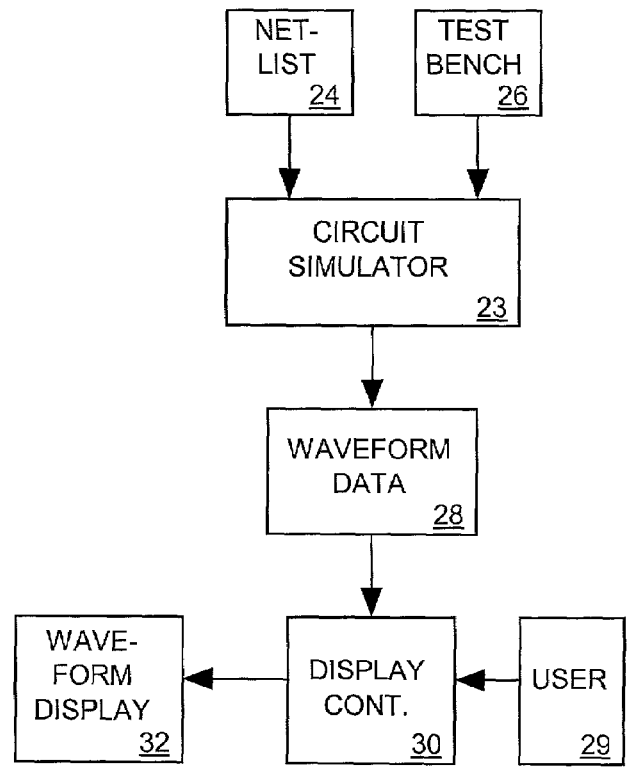
FIG. 3
(PRIOR ART)

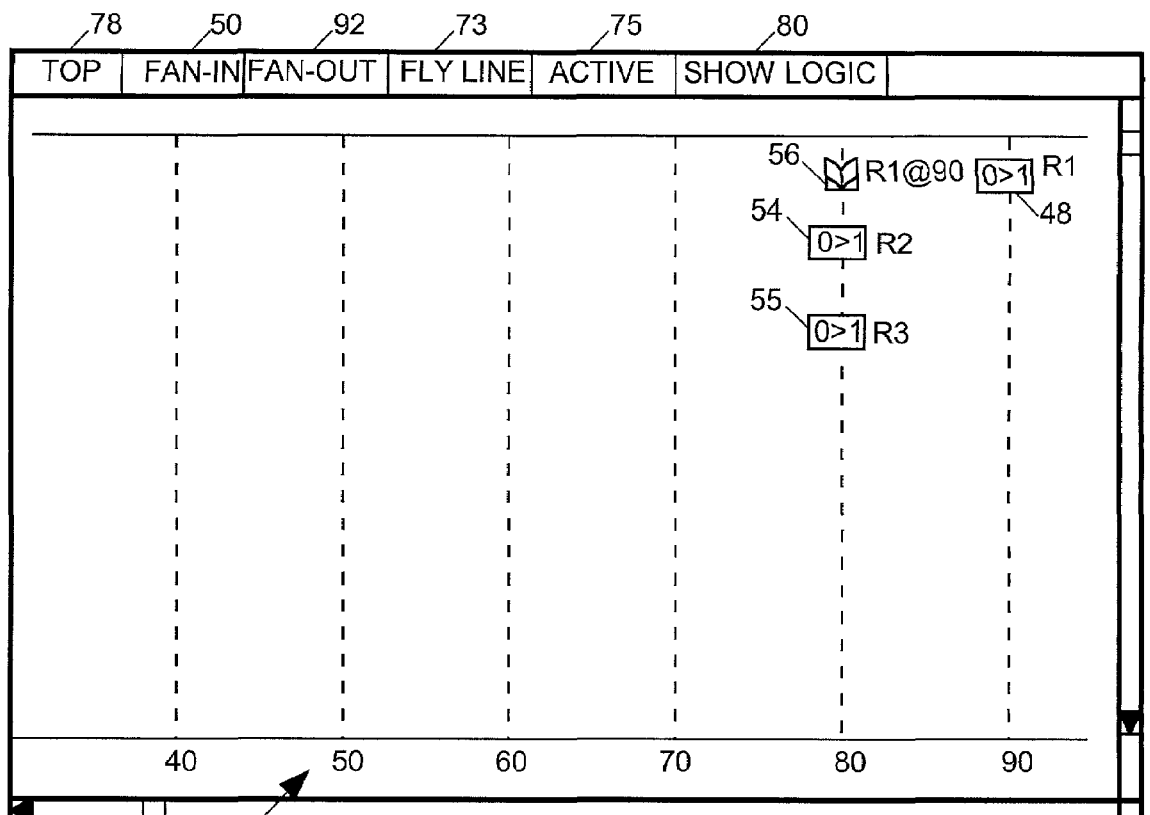
FIG. 6
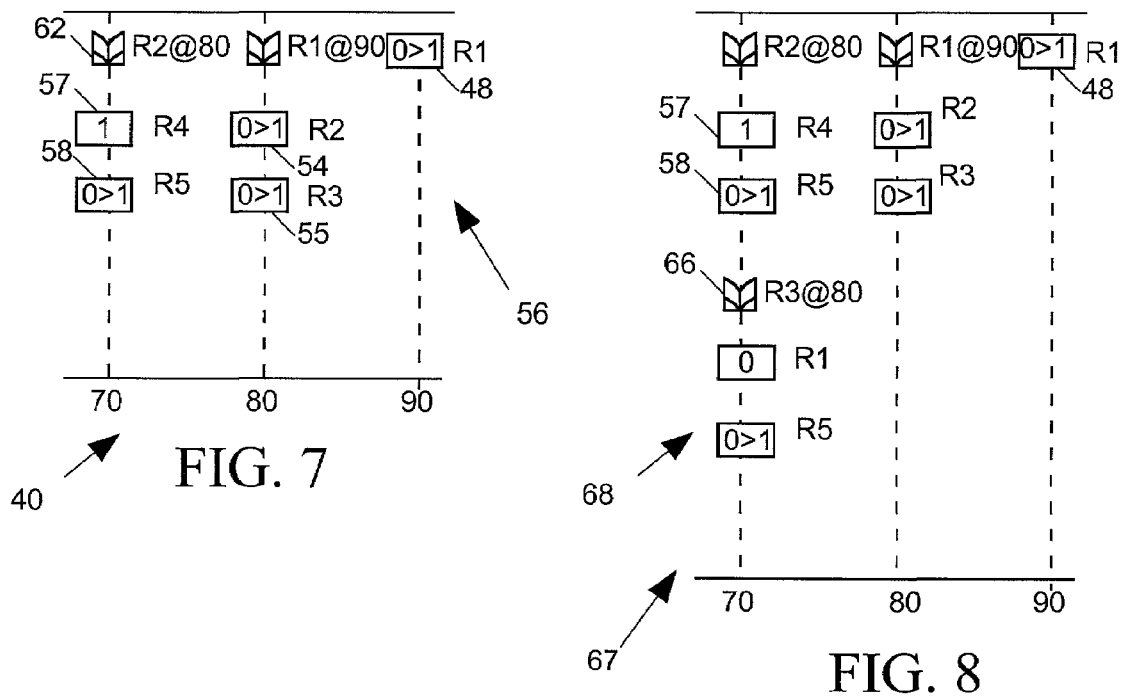
FIG. 7
FIG. 8

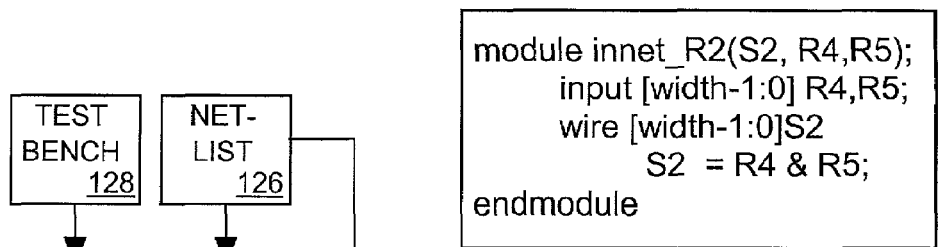
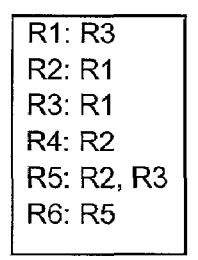
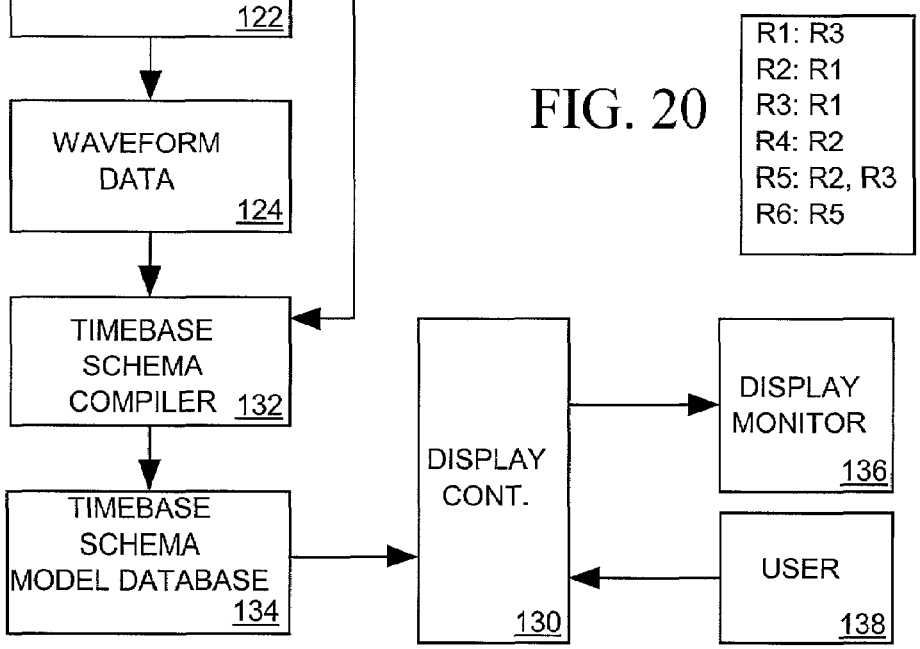
FIG. 19
FIG. 20
FIG. 17
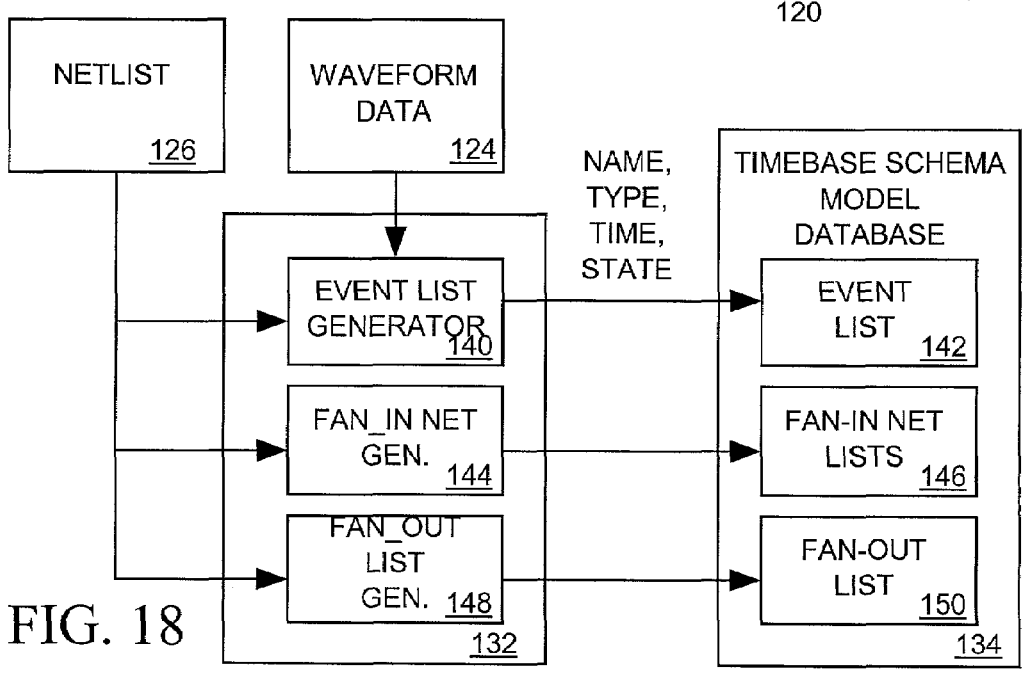
FIG. 18

SYSTEM FOR CHARACTERIZING SIMULATED CIRCUIT LOGIC AND BEHAVIOR

BACKGROUND OF THE INVENTION

1. Field of the Invention

The present invention relates in general to systems for modeling the logic and behavior of electronic circuits, and in particular to a system for characterizing an electronic circuit in a manner that graphically correlates its logic to its behavior.

2. Description of Related Art

A circuit designer can model an integrated circuit in several ways. For example FIG. 1 illustrates a schematic diagram modeling one small module MOD1 of an intigrated circuit. The schematic diagram models the logic of module MOD1 indicating that it includes AND gates 10–12, OR gates 14–15 and six registers 17–22 and showing how the parts are interconnected. The schematic diagram also labels the various input, output and internal signals and shows how they are logically related by using symbols to represent OR, AND and register logic operations. While the schematic diagram does not directly indicate how any of the signals the circuit generates would behave in response to particular input signal patterns, it provides enough information to enable a design engineer to determine the signal behavior. However since it is usually hard to figure out how even simple circuits would respond over a long period of time to various input signal patterns, designers normally use computer-based circuit simulators to do the job for them.

To use a circuit simulator a designer creates a different kind of circuit model in a form that is understood by the circuit simulator. FIG. 2 illustrates the source code of a hardware description language (HDL) or "netlist" model of the MOD1 circuit of FIG. 1. The netlist names the module and the various input, output and internal signals, indicates the bit width of each signal, and defines logical relationships between the signals.

Thus the schematic diagram of FIG. 1 and the netlist of FIG. 2 convey generally similar information about module MOD1, though in a different format. Note that these are logic models of module MOD1, not behavioral models. A logic model describes a circuit in terms of its logical structure while a behavioral model describes the circuit in terms of how its various output and internal signals change over time in response to a particular pattern of input signals. Although a human or a circuit simulator can deduce how module MOD1 might respond over time to various input signal patterns based on information presented by those models, the schematic and netlist models themselves do not directly represent the temporal behavior of the signals the module generates in response to its input signals. Designers use other kinds of models to represent the behavior of a circuit. Indeed the primary purpose of a circuit simulator is to convert a logic model of a circuit into a behavioral model of the circuit.

FIG. 3 is a block diagram illustrating a conventional circuit simulator 23 receiving a netlist 24 and a "test bench" 26 as input and producing an output waveform data 28 describing the behavior of various input, output or internal signals of the circuit modeled by the netlist. The circuit designer typically creates the test bench 26 containing code describing the behavior of the circuit input signals as functions of time and specifying initial states of the circuit's internal data storage elements. Test bench 26 also indicates which circuit input, output and/or internal signals are to be represented by waveform, data 28, and specifies parameters controlling the accuracy, duration and other aspects of the simulation. The waveform, data 28 simulator 23 produces includes a set of data sequences, each representing the magnitude of a separate circuit input, output or internal signal as a function of time.

A simulator's output waveform data 26 is often converted into a more comprehensible graphical form when a user 29 wants to view the results of the simulation. Hence most simulators include a display controller 30 for converting waveform data 38 into a waveform display 32 graphically depicting various circuit signals as functions of time.

FIG. 4 illustrates an example waveform display 32 that display controller 30 of FIG. 3 could produce from the output waveform data produced by circuit simulator 32 when simulating circuit module MOD1 of FIG. 1. Waveform display 32 illustrates the behavior of register output signals R1–R6, input signals IN1 and IN2 and output signal OUT as functions of time over a period between time 0 and 100 nanoseconds (ns) when clock signal CK1 has a period of 10 ns. Waveform display 32 could also depict the behavior of one or more of the circuits internal signals S1–S5. User 29 (FIG. 3) normally controls the waveform display, for example by telling display controller 30 which waveforms are to be displayed, adjusting the horizontal scale of the waveform display, and choosing the particular span of simulation time depicted in the waveform display.

The waveform data output 28 of simulator 23 and waveform display 32 of FIG. 4 are behavior models of the circuit because they describe the behavior of the signals the circuit generates in response to particular patterns of input signals. However these are not logic models because they do not tell us anything about the structure of the circuit that makes those signals behave that way. Note that the waveform display of FIG. 4 lacks any information about the logic of the circuit module that produced the R1–R6 signals in response to the IN1, IN2 and CK1 signals. Hence a design engineer trying to determine why signal R1 went high instead of staying low at time 90 cannot do so simply by inspecting the waveform display of FIG. 4. He or she must instead return to a logic model of the circuit, such as the schematic model of FIG. 1 or the netlist model of FIG. 2, because those models define the logic relating the behavior of the various signals. Looking at both the logic model of FIG. 1 and the behavioral model of FIG. 4, the design engineer could determine, for example, that if the R1 signal as to stay low at time SO, then at least one of the R2 and R3 signals should have been low at time 90 when the CK1 signal clocked register 17. The design engineer might also have been able to determine, for example, that the R2 signal would have been low at time 90 if either the R4 signal or the R5 signal had been low at time 80 when the CLK1 signal clocked registers 20 and 21.

That type of analysis helps design engineers to pinpoint logic errors in a circuit design, but they often find such analysis difficult because it requires them to correlate two different circuit models, the behavioral model of FIG. 4 and the logic model of FIG. 1 or 2. Since the example module MOD1 is a relatively simple circuit, it is not too difficult to determine the chain of events that lead to the R1 signal going high at time 90. However it can be hard for a design engineer to relate the behavior and logic models when the circuit being modeled is large and complex. When a design engineer is trying to figure out why a particular signal behaves as it does in a behavior model, the logic model he or she studies for an answer can in some sense present too much information. It includes not only the circuit logic that affects the signal of interest, it also shows circuit logic that may have no influence on the signal of interest. The portions of the logic model that do not influence a signal of interest obscure the relevant portions of the model that do.

The problem of relating circuit behavior to circuit logic compounds as the design engineer looks farther backward in time from a circuit event of interest to determine the logical cause of the event. For example if signal R1 went high at time 90 because the R2 and R3 signals went high at time 80, then a design engineer might like to know why the R2 and R3 signals went high at time 80. By perusing the schematic and the waveform display he or she can determine that the states of the R1, R4 and R5 signals at time 70 determine the states of the R2 and R3 signals at time 80. However as the design engineer goes farther back time looking for signal events having an influence on the signal event occurring at time 90 the number of signal events that must be considered grows and the logic involved can become quite complicated, particularly when the circuit includes feedback loops. Similarly when the design engineer wants to determine, for example, how a state change in the R6 signal at time 10 might have affected states of various signals thereafter, the logical relationship between that R6 signal state change and a state change in other signals many clock cycles later can be very complex and difficult to determine from the circuit schematic, particularly where the circuit includes feedback.

What is needed is a system for characterizing both the logic and the behavior of a circuit in a way that makes it easier for a design engineer to analyze the circuit to understand the logical causes and effects of various signal events.

BRIEF SUMMARY OF THE INVENTION

The invention relates to a system for characterizing both the logic and behavior of a circuit having a set of clocked registers interconnected by un-clocked logic.

In accordance with one aspect of the invention, the system includes a conventional circuit simulator programmed by a netlist model of the circuit's logic which simulates the circuit's response to one or more input signals. In doing so, the circuit simulator produces waveform data indicating states of each circuit input signal and of each register output signal as functions of clock signal edge timing.

In accordance with another aspect of the invention, the system also processes the netlist logic model of the circuit to determine a set of fan-in nets, each corresponding to a separate one of the circuit's registers. Each fan-in net describes the corresponding state of register's input signal as a logical function of states of one or more circuit input or register output signals. Each fan-in net models only the portion of the circuit that directly affects the state of the corresponding register's input signal between register clock cycles.

In accordance with a further aspect of the invention, the system displays a model of the circuit employing separate symbols to represent successive circuit input signal states and register output signal states at various times during the simulation. The same display also depicts logical relationships between signals based on the fan-in net models of those relationships.

It is accordingly an object of the invention to provide a system for concurrently modeling both the logic and the behavior of a circuit in a way that makes it easier for a design engineer to understand the logical causes and effects of various signal events.

The claims portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 21:
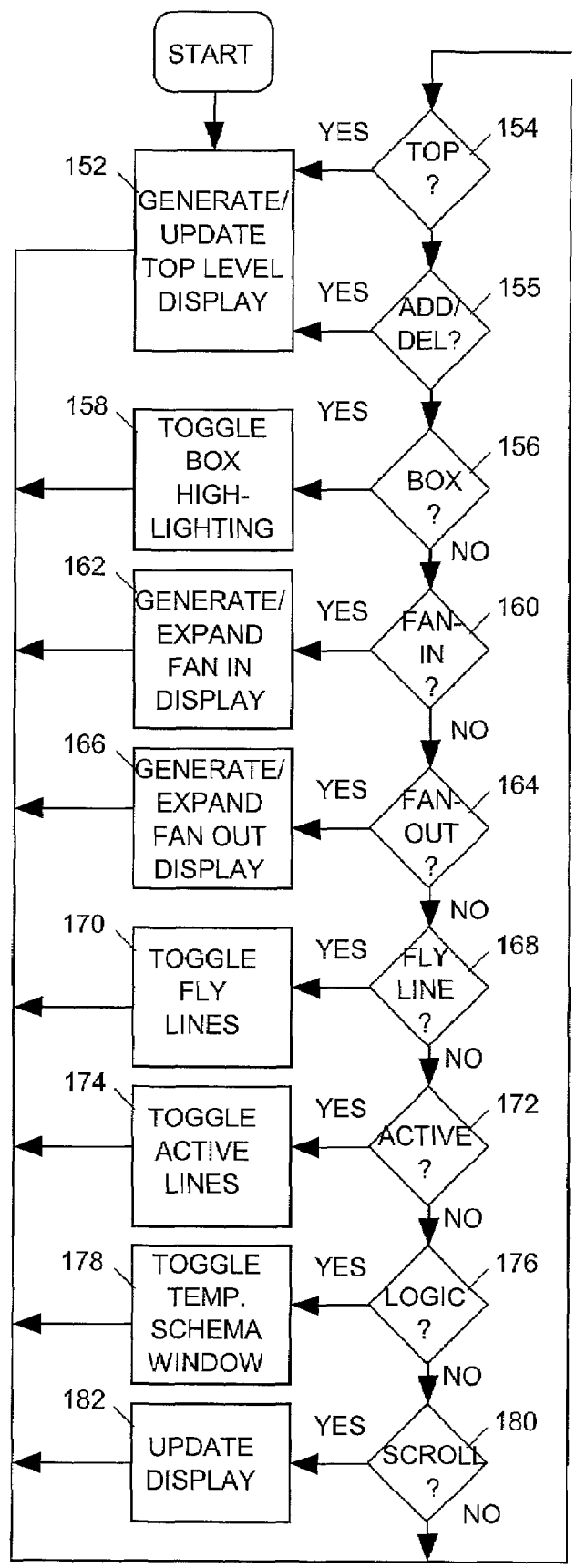
Figures 22, 23:
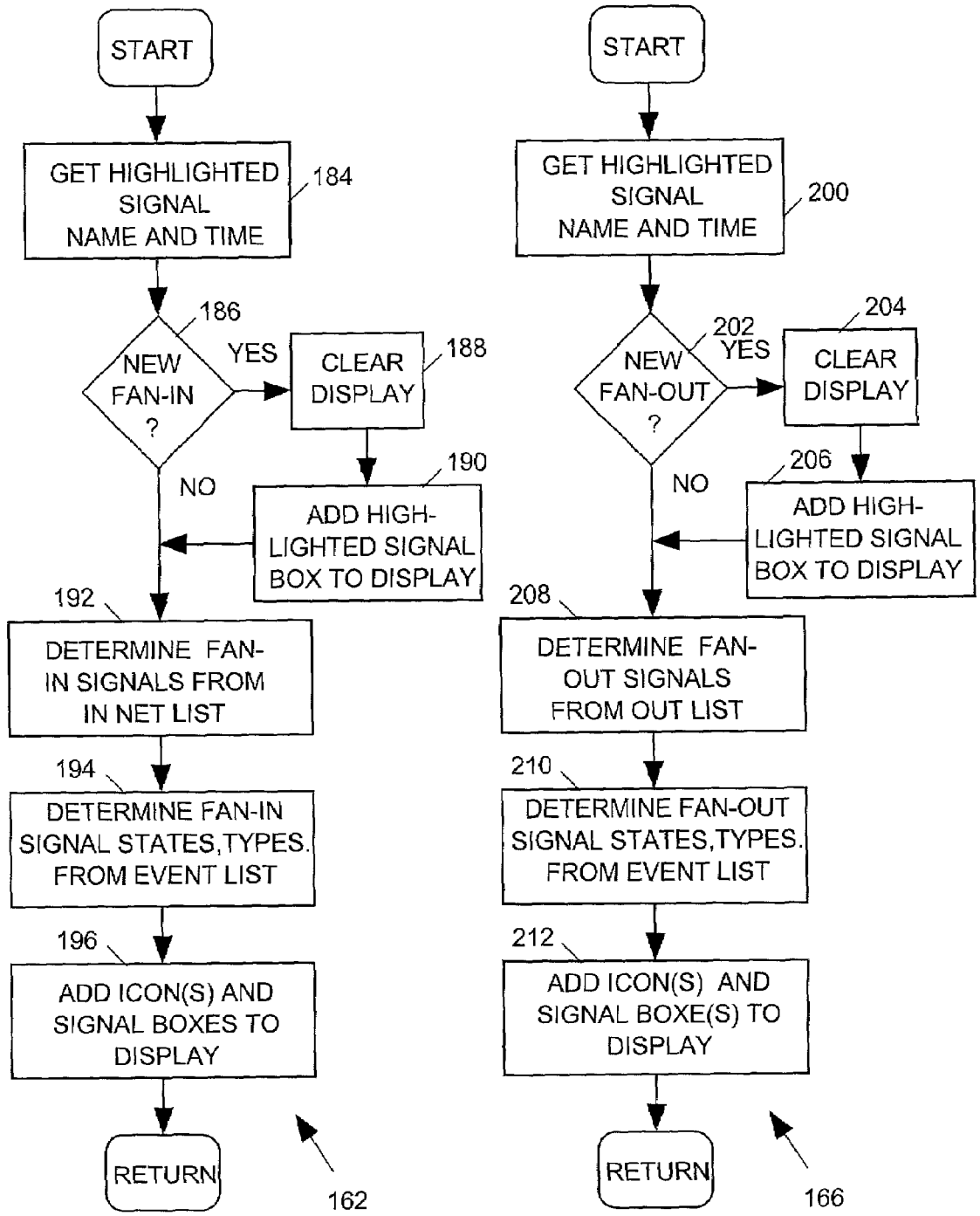

FIG. 1 is a prior art schematic diagram of an example circuit,

FIG. 2 is a prior art hardware description language (HDL) model of the circuit of FIG. 1, FIG. 3 illustrates in block diagram form a prior art circuit simulation system for simulating the behavior of the circuit described by the HDL model of FIG. 2, FIG. 4 illustrates a waveform display produced by the circuit simulation system of FIG. 3 modeling the behavior of the circuit described by the HDL model of FIG. 2, FIGS. 5–16 illustrate displays depicting aspects of a temporal schema model of the circuit of FIG. 1 produced in accordance with the invention, FIG. 17 is a block diagram illustrating a system in accordance with the invention for generating a temporal schema model of a circuit, FIG. 18 illustrates the timebase schema compiler of FIG. 17 in more detailed block diagram form, FIG. 19 depicts an example HDL language "in net" produced by the in net generator of FIG. 18, FIG. 20 depicts an example "out list" produced by the out list generator of FIG. 18, FIG. 21 is a flow chart illustrating behavior of display controller 130 of FIG. 17, FIG. 22 is a flow chart illustrating the generate/expand fan-in display step of FIG. 21 in greater detail, and FIG. 23 is a flow chart illustrating the generate/expand fan-out display step of FIG. 21 in greater detail.

DETAILED DESCRIPTION OF THE INVENTION

Prior art systems for modeling a circuit typically characterize a circuit either in terms of its logic or in terms of the behavior of the signals it produces. Thus in order to determine how a circuit's logic affects the behavior of its signals circuit design engineers have had to correlate two different types of circuit models. The present invention relates to a system for generating and displaying a "temporal schema" model of a circuit in various levels of detail. The temporal schema model incorporates both the logic and behavioral aspects of the circuit, and displays based on the temporal schema model make it easier for viewers to correlate circuit logic and behavior.

FIG. 1 illustrates a typical prior art schematic diagram modeling the logic of one small module MOD1 of an integrated circuit. The schematic diagram labels the various input (IN1 and IN2), output (OUT), register output signals (R1–R6) and other internal signals (S1–S5) and shows how they are logically related by using symbols representing AND gates 10–12, OR gates 14–16 and registers 17–22. FIG. 2 is a prior art hardware description language (HDL) or "netlist" model of the same circuit. FIGS. 1 and 2 define the logic of the MOD1 circuit, and although a circuit designer can deduce from these logic models how the circuit's various internal and output signals would respond to given input and clock signal patterns, the circuit diagram and netlist models themselves do not directly depict circuit behavior.

FIG. 3 depicts a prior circuit simulation system that can convert the netlist model 24 of the MOD1 circuit and a test bench model 26 of the behavior of the circuit's input signals into waveform data 28 and a waveform display 32, each modeling the behavior of the circuit's output and internal signal in response to input signal patterns described by the test bench. FIG. 4 is an example waveform display that the circuit simulator of FIG. 3 could produce based on the netlist model of FIG. 2 of the MOD1 circuit. Waveform display 32 models the behavior of the R1–R6, I1, I2 and OUT signals as functions of time. Such a waveform display could also graphically depict the behavior of any of the circuit's S1–S5 signals when the simulator is programmed to include data sequences describing the behavior of those signals in its output waveform data 28.

The display of FIG. 4 models the behavior of the circuit by describing the behavior of the various signals it produces in response to its input signals as functions of time. However neither the waveform display FIG. 4 nor the waveform data 28 produced by simulator 23 of FIG. 3 includes any information about the logic carried out by the circuit. While the waveform data and display are behavioral models of the circuit, they tell us nothing about why the signals behave as they do or how the signals are logically related.

Temporal Schema

Figure 5:
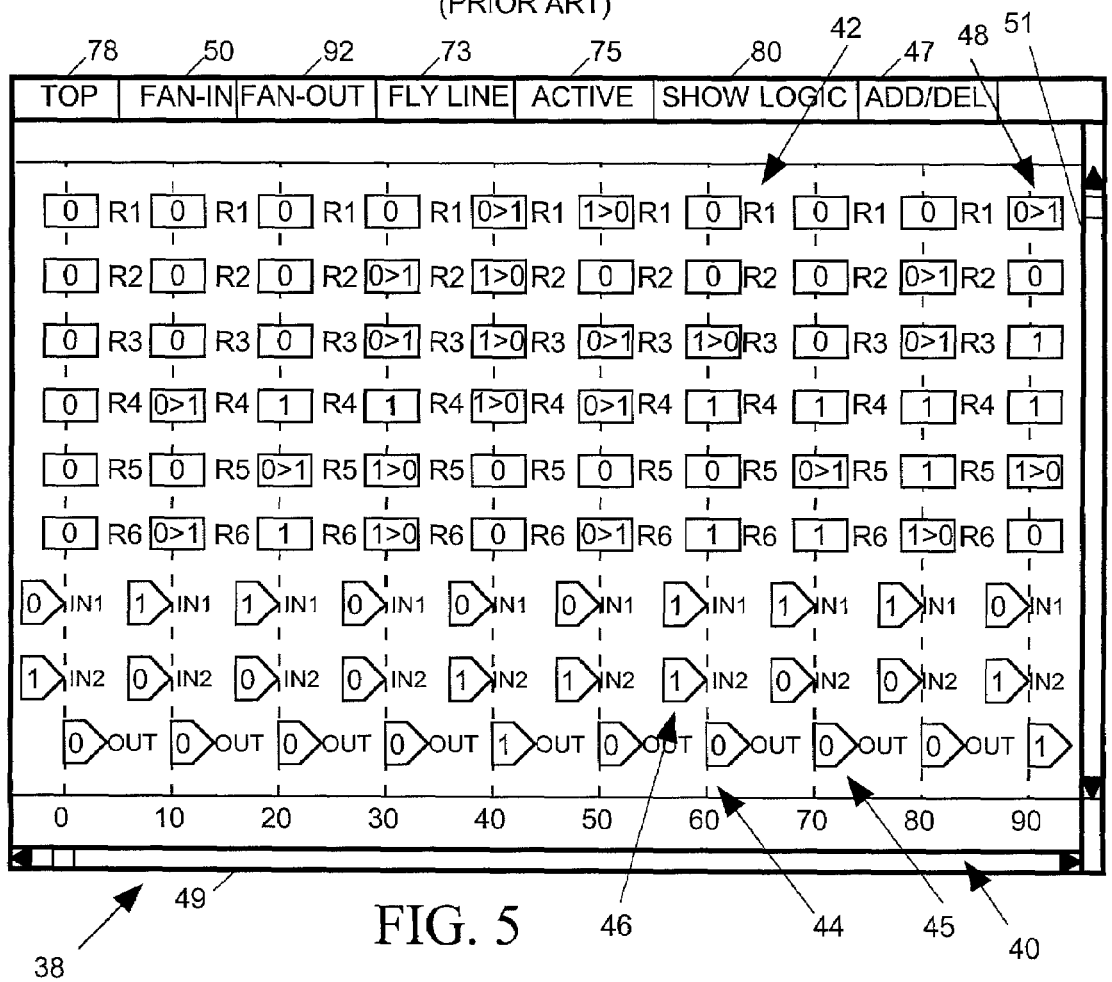

FIG. 5 depicts a display 38 produced in accordance with the invention on a computer monitor based on a "temporal schema" model of the MOD1 circuit of FIG. 1. Display 38 presents all of the information provided in the prior art waveform display of FIG. 4 regarding the behavior of signals R1–R6, I1 and I2, though it does so in a different form. Like the waveform display of FIG. 4, display 38 includes a horizontal time base 40, but instead of depicting each signal R1–R6, IN1 and IN2 as a set of graphical waveforms, the behavior of each waveform is depicted by a horizontal sequence of boxes 42 or 46, each containing data indicating the state or state transition of the signal at a time reference by the time base 40 below the boxes. For example, a "0" or a "1" in a box 42 or 46 above time 60 indicates that the signal associated with the box was low or high at that time. A "0>1" or a "1>0" symbol in a box 42 or 46 above time 60 indicates that the signal transitioned from low to high or high to low at time 60. A pull-down ADD/DEL menu 47 at the top of the display allows the user to add or delete signals from the display. A horizontal scroll bar 49 permits the user to scroll time base 40 forward or backward in time and a horizontal scroll bar 51 allows the user to scroll the display up or down to view signals when the screen is not large enough to show all the signals included in the display.

Display 38 of FIG. 5 conveys the same waveform information as the prior art waveform display of FIG. 4 and is therefore a behavioral model of the MOD1 circuit. However display 38 of FIG. 5 also includes some information about the logic of the circuit not appearing in the waveform display of FIG. 4. A rectangular box 42 centered about a timebase grid line 44 indicates the signal was produced by a register. A box 45 having a pointed end following a grid line 44 represents an output signal state while a box 46 having pointed end preceding a timebase grid line represents an input signal state. Boxes with left edges abutting grid lines 44 (not shown in FIG. 5) indicate states of internal circuit signals such as signal S1–S5 of FIG. 1 not produced by registers. Thus in addition to illustrating the behavior of each signal, display 38 also indicates whether the signal was an input signal, a register output, an output of a logic device other than a register, or an circuit output signal.

However while the shape of the boxes tells us something about the logic producing the signals the represent, it does not tell us how the signal states at the various times are logically related to one another. However as discussed below, display 38 of FIG. 5 is a "top level" display of a more comprehensive temporal schema model that does logically relate all signal states. The display of FIG. 5 acts as a convenient user interface to that more comprehensive model, and as described below, the display can be configured to depict logical relationships between signals in much greater detail.

Suppose, for example, that a system user is interested in determining why the R1 signal transitioned from low to high on the CLK1 pulse occuring at time 90. Using a conventional mouse or other pointing device to move a cursor over box 48, the user selects (mouse clicks on) box 48 to highlight it and then clicks on a "FAN_IN" menu item 50 at the top of the display. The system responds by replacing the top level display 38 of FIG. 5 with the lower level display 52 of FIG. 6. Display 52 shows only the box 48 depicting the state change in the R1 signal at time 90 and two other boxes 54 and 55 indicating states of the R2 and R3 signals at time 80. Note from the schematic digram of FIG. 1 that between CK1 signal pulses, the R1 signal state is influenced only by the R2 and R3 signal states; the R1 signal following any edge of the CK1 signal is the logical AND of the R2 and R3 signals following the preceding edge of the CK1 signal. State changes in no other signals can affect the state of the R1 signal between CLK1 signal pulses.

Display 52 includes an icon 56 immediately above boxes 54 and 55 with adjacent text "R1@90" indicating that signal states or state transitions indicated by the boxes 54 and 55 there below influence the state transition in the R1 signal at time 90. Thus display 52 of FIG. 6 shows the user that the R1 state change at time 90 is a function only of the states the R2 and R3 signals assumed at time 80. Display 52 therefore shows the viewer not only the behavior of the particular signals at times 80 and 90, it also tells the user something about the circuit logic relating the signals. In particular, display 52 indicates that the R1 signal state at time 90 is a logical function only of the R2 and R3 signals states at time 80. However this level of the display temporal schema model of the circuit does not indicate the specific nature of the function relating signals R2 and R3 to signal R1; it only indicates that there exists a logical relationship between the R1 signal state at time 90 and the R2 and R3 signal states at time 80, and that no other signal states at time 80 affect the R1 signal state at time 90.

When the user next wants, for example, to determine which events occurring before time 70 may have influenced the state change in the R2 signal at time 80, the user highlights box 54 and then again clicks on the FAN_IN menu item 50 (FIG. 5) appearing above display 52. The system then expands display 52 of FIG. 6 to produce display 56 of FIG. 7 adding boxes 57 and 58 depicting states or state changes in the R4, and R5 signals at time 70. An icon 62 and adjacent text indicate that states and state changes of those signals influence the state change in the R2 signal at time 80.

The user may then highlight the R3 box 55 of FIG. 7 and again click the FAN-IN button (FIG. 1) to tell the system to produce display 67 of FIG. 8. Display 67 expands display 56 of FIG. 7 by including another icon 66 and boxes 68 Indicating states of signals R1 and R5 at time 70 which influence the state of the R3 signal at time 80. By highlighting various boxes of FIG. 8 and again clicking the FAN-IN button, the user can tell the system to further expand the display as illustrated in FIG. 9 to include another set of boxes and icons 72 indicating states of various signals at time 60 that influence the states of signals R1, R4 and R5 at time 70.

Figure 9:
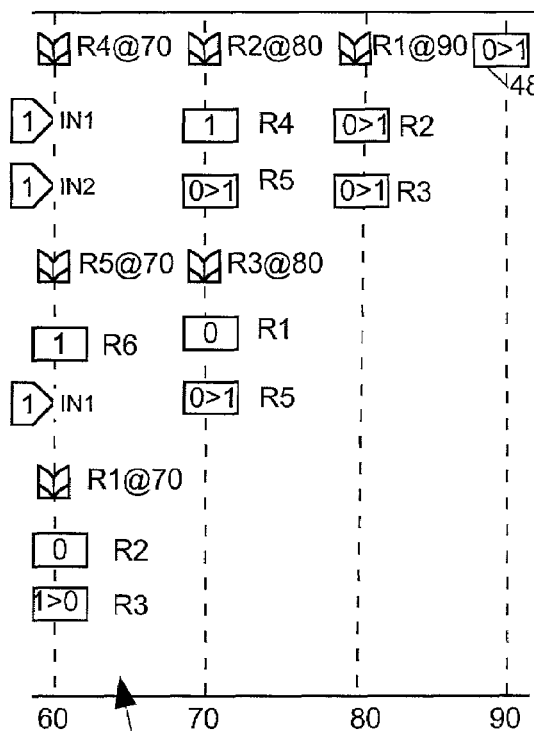
Figure 10:
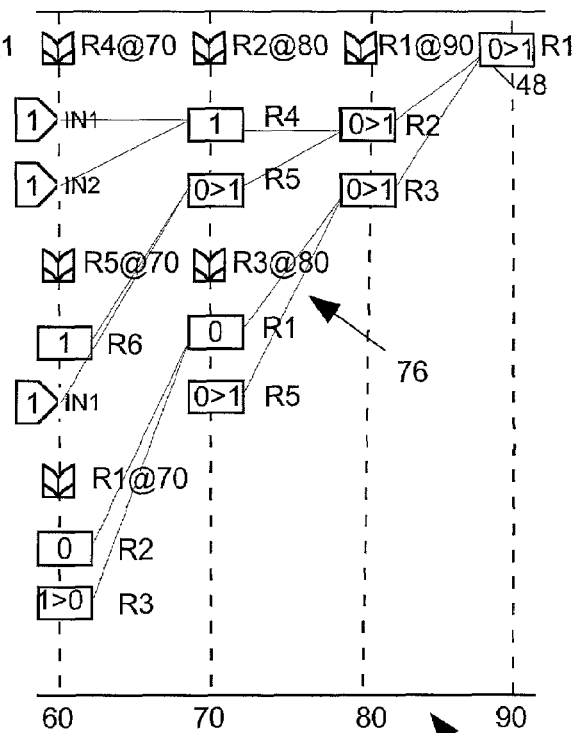
Figure 11:
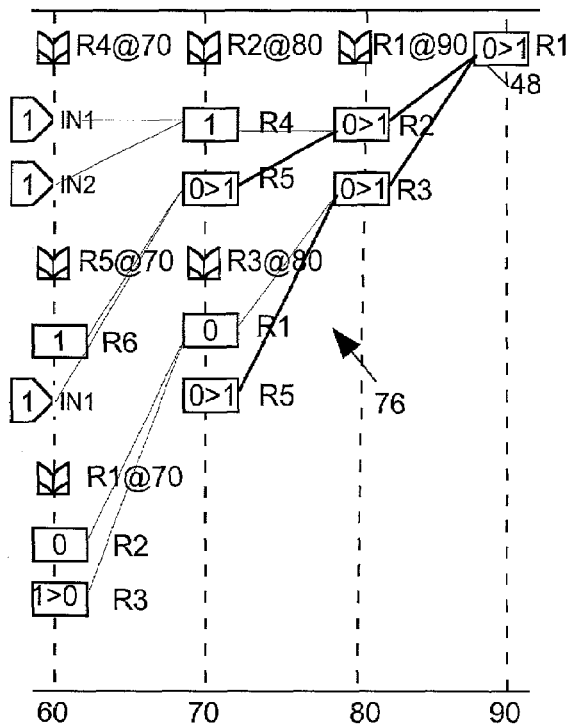

When the user thereafter highlights box 48 of FIG. 9 and clicks a "FLY-LINE" button 73 (FIG. 5) above the display, the system produces the display 74 of FIG. 10 by adding fly-lines 76 to the display of FIG. 9. The fly-lines graphically indicate fan-in relationships between signals. When the user next presses an "ACTIVE" button box 75 (FIG. 5) above the display of FIG. 10, the system modifies the display as shown in FIG. 11 to emphasize the fly lines 76 interconnecting boxes indicating that a signal is actively changing state. The active fly lines can help the user to more easily identify chains of signal state changes leading up to the state change in the R1 signal at time 90. To tell the system to return to the top level display 38 of FIG. 5, the user clicks a "TOP" button 78 (FIG. 5).

Thus the displays of FIGS. 6-11 directly tells us something that neither the waveform model of FIG. 4 nor the logic models of FIGS. 1 and 2 directly indicate. They tell us that specific states of signals at specific times are functions of specific states of other signals at other specific times. The logic models of FIGS. 1 and 2 indicate that some signals are functions of others, but they directly convey no information about specific signal states at specific times. The behavioral model of FIG. 4 indicates that specific signals have particular states at particular times, but the model doesn't tell us whether any one signal state at any given time is a function of states of any other signals at any other times.

However while the displays of FIGS. 6-11 indicate that there are logical relationships between the state change in the R1 signal at time 90 and state changes in other signals at earlier times, the displays do not indicate exactly what those logical relationships are. For example, while display 52 of FIG. 6 tells the user that the R1 signal state change at time 90 is a logical result of the R2 and R3 signal states at time 80, display 52 does not indicate the specific nature of logic involved.

Figure 12:
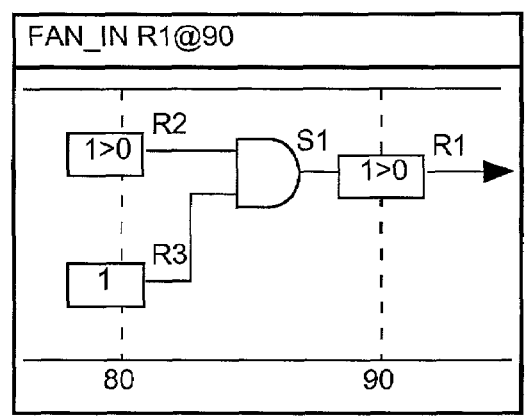

To learn more about the logical relationship between the R1, R2 and R3 signals of display 52 of FIG. 6, the user need only highlight the R1 box 48 and click a "SHOW LOGIC" button 80 (FIG. 5) above the display. The system then superimposes a window 84 on the display as illustrated in FIG. 12 graphically depicting the logical relationship between the R1 signal state at time 90 and the R2 and R3 signal states at time 80. In this case the logic relating the R1 signal to the R2 and R3 signals is depicted by an AND gate.

Figure 13:
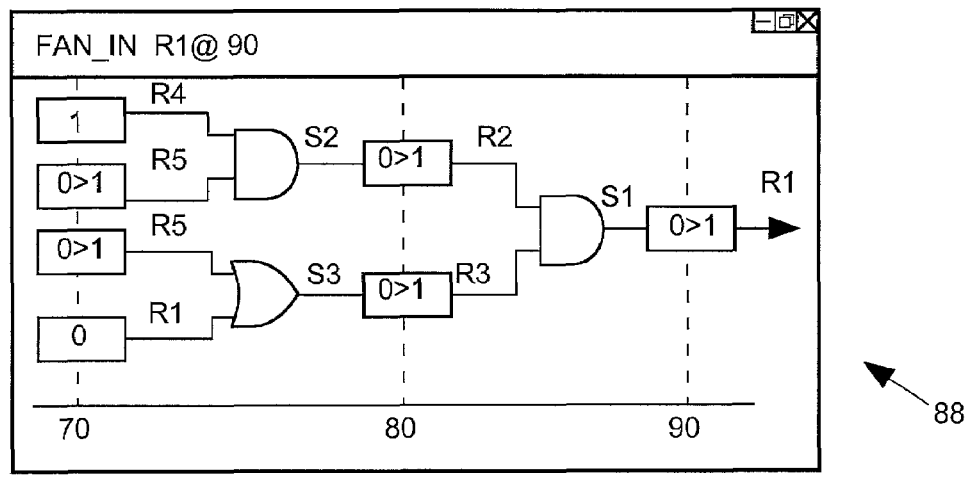

Similarly, when the user highlights box 48 of the display 67 of FIG. 8 and clicks the SHOW LOGIC button 80, the system produces the display 88 of FIG. 13 showing all of the logic relating signal events at times 70, 80 and 90. When the user then highlights box 48 of the display 74 of FIG. 10 and clicks the SHOW LOGIC button 80, the system produces display 90 of FIG. 14 relating logic between signal events occurring at times 60-90.

Figure 14:
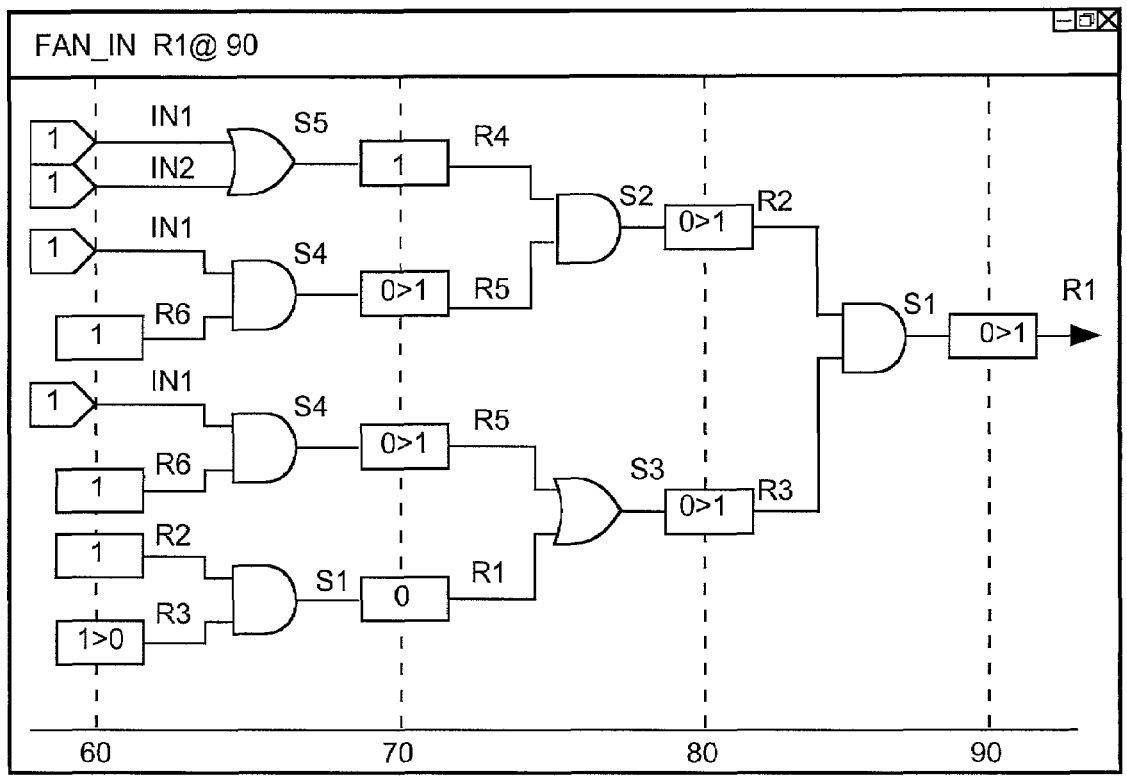

Although the temporal schemata model depicted in display 90 of FIG. 14 uses logic gate symbols to depict relationships between signals as does schematic diagram model of FIG. 1. But it is not a schematic diagram of the circuit. The temporal schema model is both a behavioral model and a logic model of the circuit because it shows how signal states change with time and because it shows how the circuit logically relates signal states at various times. Display 90 of FIG. 14 enables a user to easily see how the circuit's logic operates over several clock cycles to produce the state change in the R1 signal at time 90. The user could obtain the same insight into the relationship between the circuit's logic and its behavior by studying the prior art waveform display and schematic behavioral and logic models of FIGS. 4 and 1, but he or she would find it much more difficult to do so.

FAN_OUT

Figure 15:
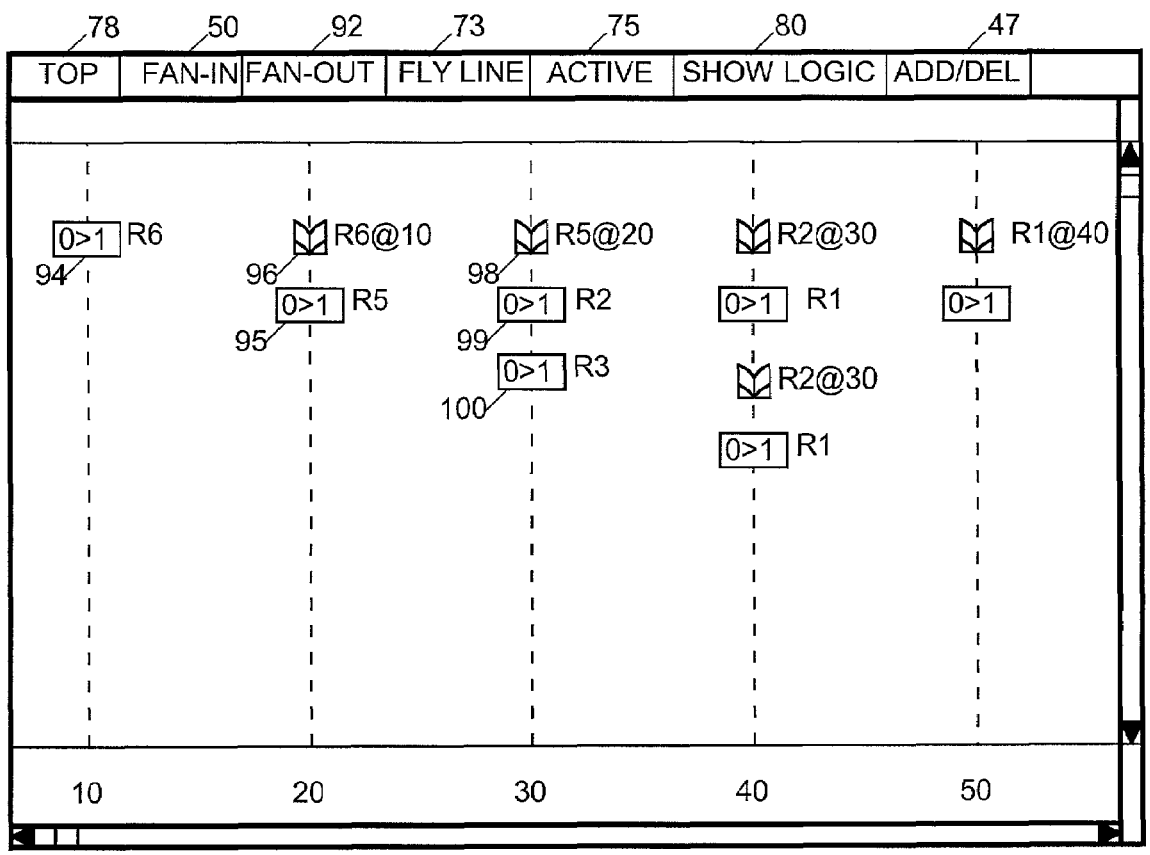

In addition to helping a user determine which prior events caused a signal to go to some state at a particular time, the present invention can also help the user to determine how a state change in a particular signal at a particular time will affect other signal state occurring many clock cycles later. For example, FIG. 5 shows that the R6 signal was of state 0 at time 0. The user might like to know whether the state of the R6 signal at time 0 affects states of any other signals thereafter. To determine this, the user highlights the R6 box for time 0 and clicks a "FAN_OUT" button 92. The system then replaces the top level display of FIG. 6 with a lower level display including boxes 94 and 95 and an icon 96 as illustrated in FIG. 15. Box 94 indicates the state of the R6 signal at time 10, box 95 indicates the state of the R5 signal at time 20, and icon 96 indicates that the signal R5 is the only signal at time 20 affected by the state of the R6 signal at time 10, as may be deduced form an inspection of the schematic diagram of FIG. 1.

When the user next highlights the R5 box 95 and again clicks FAN-OUT button 92, the system adds icon 98 and boxes 99 and 100 to the display indicating the R2 and R3 signals are the only signals affected at time 30 by the state of the R5 signal at time 20. The user can continue to expand the fan-out display to later times as illustrated in FIG. 15 by continuing to highlight more signal boxes and clicking on FAN-OUT button 92.

Thus the fan-out display of FIG. 15 allows the user to quickly determine which signal states at any of times 20-60 are logical functions of the state of the R6 signal at time 10. Although the display of FIG. 15 does not directly indicate the nature of the logical functions, when the user presses SHOW LOGIC button 80, the system responds by generating the lower level temporal schema display of FIG. 16 in a separate window. That display illustrates the logic between all of the register blocks of FIG. 15 and makes it relatively easy for the user to determine, for example, how the state change in R6 at time 10 logically influences the subsequent state change in the R1 signal at time 40.

System Architecture

FIG. 17 illustrates a system 120 in accordance with the invention for modeling the logic and behavior of an electronic circuit. System 120, capable of producing the displays of FIGS. 6-16, employs a conventional circuit simulator 122 to generate waveform data 124 in response to a netlist 126 describing the circuit and in response to a test bench 128 describing the behavior of circuit's input signals. A timebase schema compiler 132 processes the waveform data 124 describing the behavior of the circuit's input and output signals and the netlist description 126 of the circuit to produce a data base 134 forming a timebase schema model of the circuit.

A display controller 130, which produces the timebase schema display on a display monitor 136, responds to input from a user 138 by determining from user input the nature of the display to appear on monitor 136, including for example, whether it is to be a top level display, a fan-in or a fan-out display, and whether a window showing the fan-out or fan-in logic is to be displayed. Display controller 130 then acquires the data it needs to generate the display from timebase schema model database 134 and produces the appropriate display on monitor 136. Circuit simulator 122, display controller 130 and compiler 132 are suitably implemented as software routines running on a conventional computer. Circuit simulation software capable of carrying out the function of simulator 122 is conventional and not further detailed herein. Display controller 130 and timebase schema compiler 132 are described in more detail below.

FIG. 18 is a data flow diagram illustrating timebase schema compiler 132 and timebase schema model database 134 of FIG. 17 in more detail. Compiler 132 includes an event list generator 140 processing waveform data 124 and netlist 126 to produce an event list 142, a part of timebase schema model data base 134. Waveform data 124 indicates the times at which each of the circuit's signals changed state during the simulation. For each signal event included in waveform data 124, list generator 140 consults netlist 126 to determine the signal type (input, output, register output, or other internal signal) and then generates a new entry for event list 142. Each entry in the event list indicates a signal's name and type, a time, and a state or state change occurring at that time.

Compiler 132 also includes a "fan-in net list generator" 144 for processing the circuit netlist 126 describing the logic of the entire circuit to produce a separate fan-in net list 146 for each the register of the circuit. The fan-in net list for each register is an HDL description of the portion of the logic of the simulated circuit FIG. 19 that influences the state of the register's input signal between clock signal edges. FIG. 19 illustrates an example fan-in netlist for register 18 of FIG. 1 indicating that the fan-in net for the register's input signal S2 includes signals R4 and R5 and that those two signals are ANDed to produce the S2 signal.

Compiler 132 further includes a fan-out list generator 148 for processing netlist 126 to produce a fan-out list 150 portion of timebase schema model database 134. The fan-out list includes an entry for each register signal of the circuit indicating which other register signals can be influenced one cycle after a stage change in the register signal. FIG. 20 illustrates the fan-out list for the MOD1 circuit of FIG. 1. The entry for register signal R1 indicates that the R3 signal may change state one cycle after a state change in the R1 signal, as may be seen by inspection of FIG. 1. The entry for register signal R5 indicates that both register signals R2 and R3 can change state one clock cycle after the R5 signal changes state.

FIG. 21 is a flow chart illustrating behavior of display controller 130 FIG. 17. Following startup, the display controller (step 152) generates the top level display for the temporal schema model as illustrated in FIG. 5. Event list 142 of timebase schema model database 134 (FIG. 18) contains all of the information display controller 130 needs to generate the top level display including the signal name and type for each signal to be displayed. Initially the display is empty because the user has not yet selected the signals to be displayed. Thereafter, display controller 130 monitors the operation of the user's mouse on the screen to determine how to create and modify displays based on the temporal schema model of the circuit.

When the user presses the TOP button 78 of FIG. 5 (step 154) display controller 130 terminates any other display and regenerates the top level display (step 152). When the user employs the ADD/DEL menu 47 (FIG. 5) to select a signal to be added or deleted from the top level display (step 155) display control 130 updates the top level display accordingly (step 152). When the user clicks on one of the signal boxes in the display (step 156), display controller 130 toggles the highlighting of the signal box and de-highlights any other highlighted signal box in the display (step 158).

When the user presses the FAN_IN button 50 of FIG. 5 (step 160) while the current display is not a fan-in display, display controller 130 terminates the current display and generates a new fan-in display as illustrated for example in FIG. 6 for a currently highlighted box (162). When the current display is a fan-in display, the display controller 130 expands the fan-in display at step 162, for example as illustrated in FIG. 7, to add the fan-in signals for the currently highlighted signal.

When the user presses the FAN_OUT button 47 of FIG. 5 (step 164) while the current display is not a fan-out display, display, controller 130 terminates the current display and generates a new fan-out display for a currently highlighted box (166). When the current display is a fan-out display, display controller 130 expands the fan-out display at step 166 to add the fan-out signals for the currently highlighted signal, as illustrated for example in FIG. 16.

When the user presses the FLY-LINE button 73 of FIG. 5 (step 168), display controller 130 toggles the fly line display on or off (step 170) as illustrated in FIG. 10. Similarly when the user presses ACTIVE button 75 of FIG. 5 (step 172), display controller 130 toggles the active line display on or off (step 174) as illustrated in FIG. 11.

When the user presses the SHOW LOGIC button 80 of FIG. 5 (step 176), display controller 130 toggles display of a temporal schema window detailing the logic associated with any currently displayed fan-in or fan-out display (step 178), as illustrated for example in FIGS. 12–16. Display controller 130 processes the fan-in netlist 146 (FIG. 18) describing the fan-in logic for each register signal box in the current display to determine how to generate the portion of the fan-in logic display associated with that register signal box. Note, for example that the fan-in netlist for the R2 signal of FIG. 19 defines the portion of the fan-in display of FIG. 13 preceding the R2 signal box. Methods for converting netlist descriptions into schematic diagram displays are well-known to those of skill in the art.

When the user adjusts either the horizontal scroll bar 49 or vertical scroll bar 51 (step 80) to scroll the display, display controller 130 updates the current display accordingly (step 182).

The flow chart of FIG. 22 illustrates the steps display controller 130 carries out when generating or expanding a fan-in display at step 162 of FIG. 21. Display controller 130 first determines which signal box is highlighted in the current display (step 184). If the current display is not a fan-in display (step 186), display controller 130 clears the current display (step 188) and then adds the highlighted signal box back to the display (step 190). For example, in creating the fan-in display of FIG. 6 when the R1 signal box had been highlighted in a top level display, display controller 130 clears the top level display and places box 48 in the position shown in FIG. 6.

Display controller 130 then consults the fan-in net 146 (FIG. 18) for the highlighted register signal to determine which other register signals fan-in to the highlighted register signal (step 192). Thereafter display controller 130 consults event list 142 (FIG. 18) to determine the signal type and state of each fan-in signal during the preceding clock cycle (step 194) and then adds the appropriate icons and signal boxes to the fan-out display (step 196).

Figure 16:
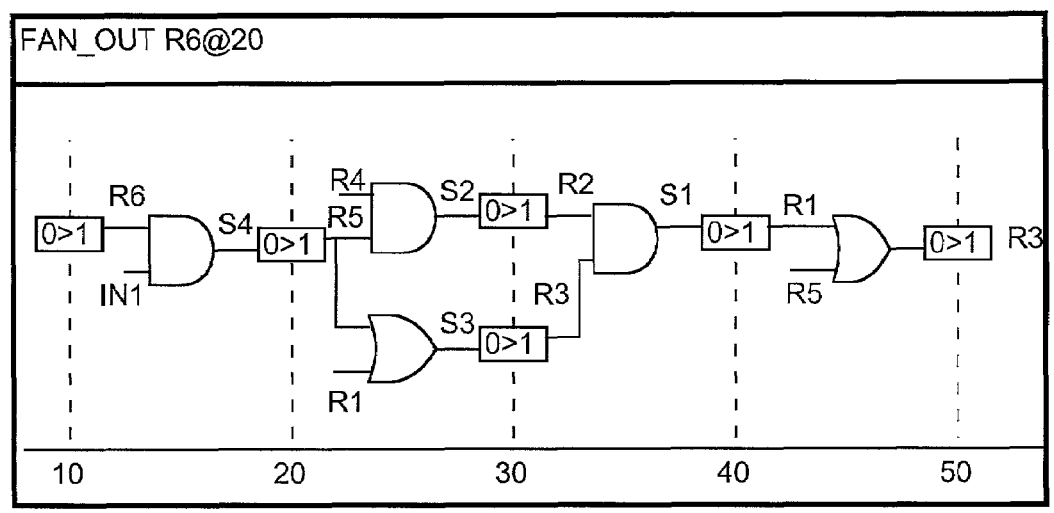

The flow chart of FIG. 23 illustrates the steps display controller 130 carries out when generating or expanding a fan-out display at step 166 of FIG. 21. Display controller 130 first determines which signal box is highlighted in the current display (step 200). If the current display is not a fan-out display (step 202), display controller 130 clears the current display (step 204) and then adds the highlighted signal box back to the display (step 206). For example, referring to the fan-out display of FIG. 15, the display controller initially adds the R6 box at time 10 to the fan-out display. Display controller 130 then consults fan-out list 150 (FIG. 18) for the highlighted register signal to determine which other register signals fan-out from the highlighted register signal (step 208). In the example of FIG. 16, the fan-out list would indicate that the R6 signal fans out only to the R5 signal since the R6 signal can affect only the R5 signal state on a next clock signal edge. Thereafter (step 210) display controller 130 consults event list to determine the signal state of each fan-out signal for the clock cycle following that of the highlighted signal. The display controller then adds the appropriate icons and signal boxes to the fan-out display (step 212).

Thus the present invention provides a system for modeling both the structure and the behavior of a circuit in a way that makes it easier for a design engineer to determine the circuit logic influencing signal events occurring during a circuit simulation. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method for enabling a user to control display of information relating to a circuit including clocked storage elements and unclocked logic elements that communicate via signals including input signals to the circuit and output signals of the storage elements and logic elements, and relating to data indicating states of the signals at a succession of discrete times, the method comprising the steps of:
   a. receiving input from the user selecting one of the succession of discrete times as a first discrete time and selecting an output signal of one of the storage elements of the circuit as a first signal;
   b. identifying a first set of all signals of the circuit, other than output signals of its unclocked logic elements, for which the state of the first signal at the first discrete time is a function of the state of every signal of the first set at a second discrete time immediately preceding the first discrete time in said succession of discrete times; and
   c. generating a display comprising first and second columns of symbols indicating signal states,
      wherein the first column includes a symbol indicating the state of the selected first signal at the first discrete time, and excludes any other symbol indicating a state of any other signal, and
      wherein the second column includes a separate symbol corresponding to each signal of the first set indicating a state of its corresponding signal at the second discrete time, and excluding any other symbol indicating a state of any other signal.

2. The method in accordance with claim 1 wherein the display excludes any schematic representation of any portion of the circuit.

3. The method in accordance with claim 1 further comprising the steps of:
   d. receiving from the user a command to show circuit logic; and
   e. responding to the command by displaying a schematic diagram only of a portion of the circuit that processes the signals of the first set produced at the second discrete time to produce the first signal at the first discrete time.

4. The method in accordance with claim 1 further comprising the steps of:
   d. receiving input from the user selecting one of the signals of the first set as a second signal and selecting the second discrete time;
   e. identifying a second set of all signals of the circuit, other than output signals of unclocked logic elements, for which the state of the second signal at the second discrete time is a function of the state of every signal of the second set at a third discrete time immediately preceding the second discrete time in said succession of discrete times; and
   f. adding to the display a third column including a separate symbol corresponding to each signal of the second set indicating a state of its corresponding signal at the third discrete time, and excluding any other symbol indicating a state of any other signal.

5. The method in accordance with claim 4 wherein at step d, the user selects said one of the signals of the first set as a second signal and selects the second discrete time by selecting the symbol for the second signal in the second column.

6. The method in accordance with claim 4 further comprising the step of:
   g. receiving from the user a command to show circuit logic; and
   h. responding to the command by generating a display of a schematic diagram only of a portion of the circuit that processes the second set of signals produced at the third discrete time to produce the first signal at the first discrete time.

7. The method in accordance with claim 6 further comprising the step of:
   i. receiving input from the user selecting another of the signals of the first set as a third signal and selecting the second discrete time;
   j. identifying a third set of all signals of the circuit, other than output signals of unclocked logic elements, for which the state of the third signal at the second discrete time is a function of the state of every signal of the third set at the third discrete time immediately preceding the second discrete time in said succession of discrete times; and
   k. adding to the third column of symbols a separate symbol corresponding to each signal of the third set indicating a state of its corresponding signal at the third discrete time.

8. The method in accordance with claim 7
   wherein at step d, the user selects the second signal and the second discrete time by selecting the symbol for the second signal in the second column, and
   wherein at step i, the user selects the third signal and the second discrete time by selecting the symbol for the third signal in the second column.

9. The method in accordance with claim 7 further comprising the step of:
   l. receiving a another command from the user; and
   m. responding to the another command by adding to the display, a separate fly line for each symbol in the second column corresponding to a signal of the first set, connecting that symbol to the symbol in the first column for the first signal, a separate fly line for each symbol in the third column corresponding to a signal of the second set, connecting that symbol to the symbol in the second column for the second signal, and a separate fly line for each symbol in the third column corresponding to a signal of the third set, connecting that symbol to the symbol in the second column for the third signal.

10. The method in accordance with claim 9 further comprising the step of:
   n. receiving a second command from the user; and
   o. responding to the second command by identifying each signal of the second set that changed state from the third discrete time to the second discrete time, and by altering the display to visually distinguish every fly line in the display that connects the symbol in the second column corresponding to an identified signal of the second set to the symbol in the first column from every other fly line in the display.

11. A method for enabling a user to control display of information relating to a circuit including clocked storage elements and unclocked logic elements that communicate via signals including input signals to the circuit and output signals of the storage elements and logic elements, and relating to data indicating states of the signals at a succession of discrete times, the method comprising the steps of
   a. receiving input from the user selecting one of the succession of discrete times as a first discrete time and selecting an output signal of one of the storage elements of the circuit as a first signal;
   b. identifying a first set of all storage element output signals of the circuit that are of a state at a second discrete time immediately following the first discrete time in said succession of discrete times that is a function of the state of the first signal at the first discrete time; and
   c. generating a display comprising first and second columns of symbols indicating signal, states,
      wherein the first column includes a symbol indicating the state of the selected first signal at the first discrete time, and excludes any other symbol indicating a state of any other signal, and
      wherein the second column includes a separate symbol corresponding to each signal of the first set indicating a state of its corresponding signal at the second discrete time, and excludes any other symbol indicating a state of any other signal.

12. The method in accordance with claim 11 wherein the display excludes any schematic representation of any portion of the circuit.

13. The method in accordance with claim 11 further comprising the steps of:
   d. receiving from the user a command to show circuit logic; and
   e. responding to the command by displaying a schematic diagram only of a portion of the circuit that processes the first signal generated at the first discrete time to produce the signals of the second set at the second discrete time.

14. The method in accordance with claim 11 further comprising the steps of:
   d. receiving input from the user selecting one of the signals of the first set as a second signal and selecting the second discrete time;
   e. identifying a second set of all signals of the circuit other than output signals of unclocked logic elements, wherein every signal of the second set is of a state at a third discrete time immediately following the second discrete time in said succession of discrete times that is a function of the state of the second signal at the second discrete time; and
   f. adding to the display a third column including a separate symbol corresponding to each signal of the second set indicating a state of its corresponding signal at the third discrete time, and excluding any other symbol indicating a state of any other signal.

15. The method in accordance with claim 14 wherein at step d, the user selects said one of the signals of the first set as a second signal and selects the second discrete time by selecting the symbol for the second signal in the second column.

16. The method in accordance with claim 14 further comprising the step of:
   g. receiving from the user a command to show circuit logic; and
   h. responding to the command by generating a display of a schematic diagram only of a portion of the circuit that processes the first signal produced at the first discrete time to produce the signals of the third set at the third discrete.

17. The method in accordance with claim 15 further comprising the step of:
   i. receiving input from the user selecting another of the signals of the first set as a third signal and selecting the second discrete time;
   j. identifying a third set of all signals of the circuit, other than output signals of unclocked logic elements, wherein each signal of the third set is of a state at the third discrete time that is a function of the state of the third signal at the second discrete time; and
   k. adding to the third column a separate symbol corresponding to each signal of the third set indicating a state of its corresponding signal at the third discrete time.

18. The method in accordance with claim 17
   wherein at step d, the user selects the second signal and the second discrete time by selecting the symbol for the second signal in the second column, and
   wherein at step j, the user selects the third signal and the second discrete time by selecting the symbol for the third signal in the second column.

* * * * *